United States Patent [19]

Mullarkey

[11] Patent Number: 5,039,381

[45] Date of Patent: Aug. 13, 1991

[54] METHOD OF ELECTROPLATING A PRECIOUS METAL ON A SEMICONDUCTOR DEVICE, INTEGRATED CIRCUIT OR THE LIKE

[76] Inventor: Edward J. Mullarkey, 5501 Seminary Rd., No. 1404 S., Falls Church, Va. 22041

[21] Appl. No.: 356,955

[22] Filed: May 25, 1989

[51] Int. Cl.$^5$ .......................... C25D 5/18; C25D 7/12
[52] U.S. Cl. .................................. 204/47.5; 204/345; 204/58.5; 204/DIG. 9
[58] Field of Search ....................... 204/34.5, 15, 47.5, 204/47, 46.1, 52.1, 58.5, DIG. 9

[56] References Cited

U.S. PATENT DOCUMENTS

| | | |
|---|---|---|
| 962,924 | 6/1910 | Wohlwill . |
| 2,443,599 | 6/1948 | Chester . |
| 2,824,830 | 2/1958 | Hausner .......................... 204/45.1 |
| 2,852,447 | 9/1958 | Hausner . |
| 3,239,439 | 3/1966 | Helmke . |
| 3,503,860 | 3/1970 | Inoue ................................ 204/47.5 |
| 3,505,182 | 4/1970 | Pokras . |
| 3,616,434 | 10/1971 | Hausner . |
| 3,627,648 | 12/1971 | Waggener ........................... 204/27 |
| 4,133,725 | 1/1979 | Lerner et al. . |
| 4,238,300 | 12/1980 | Yoshida .............................. 204/47.5 |
| 4,369,205 | 1/1983 | Wingerling et al. . |
| 4,377,450 | 3/1983 | Okinaka . |
| 4,478,691 | 10/1984 | Abys . |
| 4,481,091 | 11/1984 | Brus et al. . |
| 4,505,787 | 3/1985 | Fuller et al. . |
| 4,687,552 | 8/1987 | Early et al. ........................... 204/15 |
| 4,767,507 | 8/1988 | Wilkinson .......................... 204/44.3 |

OTHER PUBLICATIONS

A. K. Graham, Electroplating Engineering Handbook, second edition, Reinhold Publishing Corp., New York, 1962, pp. 480-490.

D. Summers, "A Process for Two-Layer Gold IC Metalllization," *Solid State Technology*, 12/83, pp. 137-141.
M. Bluestone, "The Quest for Efficiency in Plating," *Chemical Week*, 10/16/85, pp. 18-19.
Eisenberg et al., "Gravity Field Effects on Zinc Anode Discharge in Alkaline Media," *Journal of the Electrochemical Society*, pp. 909-915, Oct. 1961.
Mullarkey, "Accurate Gyro Balancing," *Electronics*, pp. 81-82, 10/25/63.
Tsuya et al., "Perpendicular Magnetic Recording by Anodic Oxidation," *ONRFE Sci. Bul.*, 12(3), pp. 1-5, 1987.
Tobias, *Advances in Electrochemistry and Electrochemical Engineering*, vol. 2, Interscience Publishers, pp. 2-3, 82-87, 164-167 and 266-269.

*Primary Examiner*—John F. Niebling
*Assistant Examiner*—William T. Leader
*Attorney, Agent, or Firm*—Lowe, Price, Leblanc & Becker

[57] ABSTRACT

A method for electroplating a layer of a precious metal, copper or aluminum on a surface of a semiconductor device, an integrated circuit, or the like employs an electrolytic cell in which the cathode comprises a semiconductor device, an integrated circuit device, or the like, having a surface for receiving the precious metal layer. The surface is oriented in a position normal to a vector representing the acceleration of gravity and facing the anode of the cell. An electroplating direct current on the order of about 0.1 milliamp/cm$^2$ is employed while superimposing a time varying electromagnetic field in the range of about 1 to about 100 megahertz on the direct current. The electroplating current and the electromagnetic field are employed in the absence of convection, i.e. stirring, in the electrolyte. The product produced by the described method comprises a smooth, evenly distributed layer of the precious metal having a microstructure that is characteristic of single crystals.

26 Claims, 1 Drawing Sheet

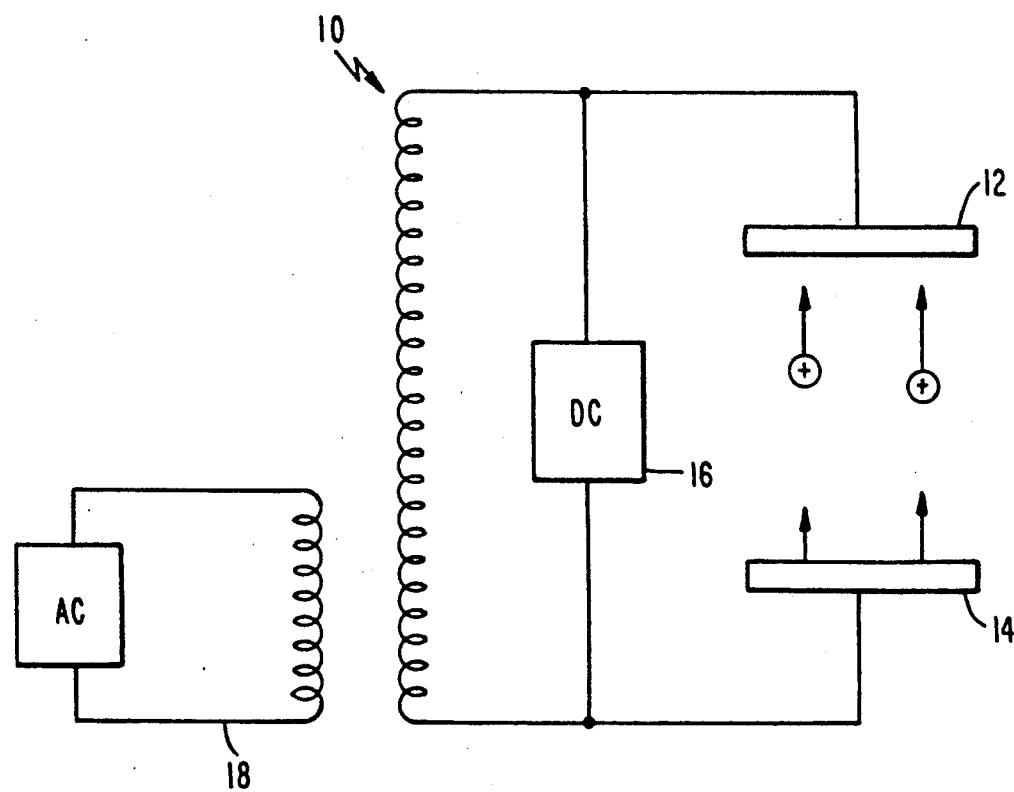

METHOD OF ELECTROPLATING A PRECIOUS METAL ON A SEMICONDUCTOR DEVICE, INTEGRATED CIRCUIT OR THE LIKE

FIELD OF THE INVENTION

The present invention relates to a method for electroplating a layer of a precious or other metal on a surface of a semiconductor device, an integrated circuit device or the like. More particularly, the present invention relates to a method for electroplating a layer of a precious metal wherein an electromagnetic field is superimposed on the electroplating current and the electroplating is effected in the absence of convection, i.e. stirring, in the electrolyte. The invention also relates to the products produced by such methods, which products include a smooth, evenly distributed layer of the precious metal having a microstructure that is characteristic of single crystals.

BACKGROUND OF THE INVENTION

In the integrated circuit industry, there is a trend toward increasing complexity of integrated circuits and circuit elements packed to limit density on substrates and chips. Accordingly, there is also a companion need for more precise printed circuit interconnections. Close dimensional tolerances on the order of fractions of a micrometer require smooth, coherent electrodeposits, typically of the noble metals, of uniform thickness and conformity, particularly free of voids, laminations and protrusions, features that in current practice are hardly if ever achieved.

The metallization or the provision of interconnecting metal lines in semiconductor devices and integrated circuits is currently accomplished using two types of processes. In the first type of process, commonly referred to as additive metallization, a metal, for example a precious metal such as gold, is selectively applied to the desired surface by electroplating in the areas where metallization is desired. In the second type of process, commonly referred as subtractive metallization, a metal, for example aluminum, is applied to the entire area of the desired surface. Various methods are used for applying the aluminum, for example bias sputtering and the like. The desired circuit interconnection pattern is then formed by removing portions of the deposited metal, for example by etching.

Both of these types of metallization processes have advantages and disadvantages related to the configurations of the resulting patterns and their electrical properties. Although precious metals such as gold are more costly than aluminum, in the case of VSLI circuits, the use of plasma etching to form small geometry lines and spaces (having, for example, widths of approximately 2 microns) will substantially increase the cost of aluminum metallization. Moreover, gold interconnects can be formed by electroplating which does not require special etching techniques to obtain anisotropy. Rather, the minimum metal pitch is determined by the resolution capability in the positive photoresist which is employed. Electroplating also provides good step coverage, generally making it unnecessary to taper etch first metal lines or via contacts as is frequently required in processes employing aluminum. However, the additive processes are limited by the ability of the electrodeposits to conform to the photolithogrophy.

A two-layer gold metallization process for bipolar VLSI circuits is disclosed by Summers, *Solid State Technology*, Dec. 1983, pages 137–141. The Early et al U.S. Pat. No. 4,687,552 similarly discloses the use of the Summers method for integrated circuit metallization. General techniques of electroplating and electrodepositing precious metals and/or precious metal alloys are also disclosed in the Wohlwill U.S. Pat. No. 961,924, the Pokras U.S. Pat. No. 3,505,182, the Dettke et al U.S. Pat. No. 3,749,650, the Okinaka U.S. Pat. No. 4,377,450 and the Abys U.S. Pat. No. 4,478,691.

Electroplating of metals has also been conducted in the presence of high frequency fields. For example, the Hausner U.S. Pat. No. 2,824,830 discloses an electroplating process which involves superimposing on the D.C. field in the electrolyte at least two high frequency fields whose frequencies differ slightly. Hausner discloses that the process provides an extremely dense, finely crystalline metal deposit which is more strongly bonded to its base. The Inoue U.S. Pat. No. 3,503,860 discloses a process for the low-temperature ionic diffusion of a substance deposited on a metallic substrate in an electrolyte. Inoue discloses that the current applied is predominately unidirectional with a super imposed high frequency component having a frequency of 100 kHz to the order of several mHz. A substance is suspended in the electrolyte and migrates to the substrate where the current causes the substance to ionically diffuse into the substrate. Suitable substances include various metal powders.

However, as noted by Bluestone, *Chemical Week*, Oct. 16, 1985, pages 18 19, there is a continual search for plating methods which deposit metal more selectively and more efficiently while minimizing adverse environmental effects. Of particular interest are plating methods which either use smaller quantities of gold or use substitute materials. While the semiconductor industry has recently been employing more silver in place of gold in plating methods, the circuit board innerconnector industry has not made a similar change. Irregularities which occur in electrodeposits increase the amount of metals, for example gold, which are required. Thus, a significant need exists for electroplating methods which deposit metal with increased selectivity and efficiency.

SUMMARY OF THE INVENTION

Accordingly, it is an object of the present invention to provide an electroplating method for depositing a precious metal on a semiconductor device, an integrated circuit or the like. It is a further object of the invention to provide such an electroplating method which results in the formation of a precious metal deposit which is smooth and evenly distributed and exhibits a microstructure that is characteristic of single crystals. It is a further object of the invention to provide such an electroplating method which reduces the amount of precious metal which is required for metallization of a semiconductor device or an integrated circuit, as compared with prior art methods.

These and additional objects and advantages are provided by the present invention which relates to methods for electroplating a precious metal on a semiconductor device, an integrated circuit or the like. The methods according to the invention employ an electrolytic cell which comprises a cathode, an anode, a direct current source and an aqueous electrolyte containing a precious metal compound dissolved therein. The cathode comprises the semiconductor device, the integrated circuit or the like having a surface for receiving a layer of the precious metal. The surface for receiving the precious metal is oriented in a position normal to a vector representing the acceleration of gravity, usually a horizontal position, and facing the anode of the electrolytic cell which is positioned in the direction of the acceleration of gravity. An electroplating direct current is employed in the electrolytic cell while superimposing a time varying electromagnetic field on the electroplating current. The direct current is at or below a value at which the current yield for the deposition is 100 percent, i.e., the number of metal ions arriving at the cathode is equal to the number of electrons. No natural convection can occur in these circumstances and physical stirring is not employed. The electroplating methods of the invention provide a smooth, evenly distributed layer of the precious metal. Additionally, the precious metal deposits produced according to the methods of the present invention are relatively free of intergranulation and lamination and otherwise exhibit the characteristics of single crystals.

These and additional objects and advantages provided by the methods according to the present invention will be more fully understood in view of the following detailed description.

BRIEF DESCRIPTION OF THE DRAWING

The drawing is a single figure which sets forth a schematic diagram of an electrolytic circuit 10 employed in the methods of the present invention. The electrolytic circuit includes a horizontally positioned substrate 12 representing the cathode, an anode 14 and a direct current source 16. A superimposed electromagnetic field is provided by an alternating current source 18.

DETAILED DESCRIPTION

The electroplating methods according to the present invention employ a direct current in an electrolytic cell in which the cathodes comprises a semiconductor device, an integrated circuit or the like having a surface for receiving the precious metal. A time varying electromagnetic field is superimposed on the electroplating direct current, and the electroplating current and the electromagnetic field are employed in the absence of forced convection, i.e., stirring in the electrolyte. The methods according to the invention provide control of the primary current distribution over the surface which receives the electrodeposit (i.e., in the form of interconnection patterns or the like), and maintains the primary current distribution evenly thereover during the electrolysis process. This control is achieved via the analogy between diffusion flow and primary current distribution where a steady state has been established and in the absence of convection.

In accordance with an important feature of the present methods, the surface of the work piece, namely the semiconductor device, the integrated circuit or the like, for receiving the precious metal layer, is oriented in a position which is normal to the vector representing the acceleration of gravity, usually a horizontal position. In accordance with another important feature of the present methods, a high frequency AC field is superimposed on the current producing the electrolysis. The resulting deposits are of a regular geometry, highly conformal and uniformly distributed in the plane of the workpiece surface. Additionally, the deposits exhibit the microstructural features of single crystals. It is believed, although the inventor does not intend to be limited by such belief, that a specific mechanism causes the rate of ion diffusion to be significantly enhanced by the high frequency so as to permit steady state electrolysis in the absence of convection. It is believed that the mechanism involves the response of metal ion hydrates formed from the metal and the aqueous solution at the solid-liquid interface between the surface receiving the electrodeposit and the electrolyte in a way that speeds the cations through the diffusion layer and to crystal sites in a regular or ordered pattern. Thus, the methods of the present invention allow electrodepositing of relatively massive amounts of metals in the absence of free or forced convection. Such are the conditions very near the surface to be plated where hydrodynamic flow is in the range of low to non-existent. The surface to be plated is arranged as to be above the anode and in a geometric plane normal to a vector representing the acceleration of gravity. As may be apparent, the horizontal positioning of the surface to be plated is not required in a gravity-free environment such as outer space. In these conditions, like those above, the surface structure and the structure of the immediate electrolyte control the nature of the deposits which are produced with ions provided solely by means of diffusion and electric migration.

As noted above, the methods according to the present invention employ an electrolytic cell comprising a cathode, an anode, a direct current source and an aqueous electrolyte containing a precious metal compound dissolved therein. The cathode comprises a semiconductor device, an integrated circuit or the like which includes a surface for receiving a layer of the precious metal. The surface for receiving the layer of the precious metal may be photolithographically patterned whereby the layer of precious metal is deposited in a pattern of fine lines. The surface of the work piece, namely the semiconductor device, integrated circuit, or the like, for receiving the precious metal layer, is oriented in a position normal to a vector representing the acceleration of gravity, usually a horizontal position, and facing the anode of the electrolytic cell which is positioned in the direction of the acceleration of gravity with respect to the surface receiving the deposit. The orientation of the work piece is normal to the vector of gravity acceleration and therefore eliminates convection in the electrolyte. This in turn contributes to the uniform current distribution at the solid-liquid interface.

The electroplating direct current is on the order of 0.1 milliamp/cm$^2$. As a result, the current is low enough so as not to overwhelm the speed of the ions flowing through the electrolyte solution whereby the ions travel at a rate at which they may be plated on the surface by diffusion and electric migration. The lower limit of electroplating current which may be employed is determined as a practical matter by the time required for the electroplating process.

The electromagnetic field which is superimposed on the direct current enhances the diffusion, mobility or mass transport of electrolytes in solution. It is believed that the enhancement occurs by altering the structure of the water-metal ion complexes such that the ions are capable of taking up crystal sites on the work piece surface in a manner that produces metal deposits which are of single crystalline appearance. A time varying electromagnetic field is employed, preferably in the range of from about 1 to about 100 megahertz. If the electromagnetic field is too low, the water-metal ion complexes do not interact. Conversely, if the electromagnetic field is too high, the metal ion complexes do not interact. Preferably, the time varying electromagnetic field is in the range from about 10 to about 15 megahertz, and more preferably is about a decade megahertz, 10 megahertz, or 12 megahertz. The electroplating current and the electromagnetic field are both employed in the absence of convection, i.e., physical stirring, in the electrolyte.

In the beginning of the electrolysis when the voltage increases with time, the region in the vicinity of the cathode work piece is progressively depleted, thereby establishing a concentration gradient in the solution. When a steady state is achieved, the concentration of the cation at the cathode-electrolyte interface stabilizes with respect to time at a level sufficient to support the electrolysis. Plating continues to produce a deposit that is flat faced and mirror-like with a microstructure which is free of voids, intergranulation and lamination. The electrodeposit also has the appearance of a single crystal. When the voltage is steady with respect to time, the concentration of the cation at the cathode-electrolyte interface is independent of time. At steady state, the concentration of the cation is sufficient to support the electrolysis. Again, a deposit is formed which is flat faced and mirror-like with a microstructure free of voids, intergranulation and lamination and which exhibits a single crystal appearance.

The electroplating direct current and the electromagnetic field are employed for a time sufficient to produce a deposit of desired thickness. In many applications, it is desirable that the direct current and the electromagnetic field are employed for a time sufficient to produce a smooth, deposited layer of the precious metal in a thickness in the range of about 1 to 10 microns.

Metals which are suitable for use in the methods according to the present invention include gold, silver, copper and palladium. Owing to the preferred use of gold in integrated circuit interconnections, gold is likewise a preferred metal for use in the methods of the present invention. Compounds containing these metals and which exhibit at least partial solubility in water are suitable for use in the aqueous electrolyte employed in the electrolytic cell. Many such metal compounds are known in the art.

The methods according to the present invention are advantageous in that they may be performed at ambient temperature. Elevated temperatures are not required in order to practice the present electroplating methods and produce the smooth, flat electrode deposits exhibiting microstructures free of voids, irregularities and laminations.

As noted above, the practice of the present methods in a gravity-free environment does not require that the semiconductor device, integrated circuit device or the like workpiece be oriented horizontally and above the anode of the electrolytic cell.

Because the methods of the invention produce a smooth, evenly distributed flat deposit having a microstructure free of voids, these methods may be used to form interconnections and the like of smaller thicknesses than are required when methods resulting in nonhomogeneous deposits are employed. Thus, the methods of the invention require a smaller amount of metal to form a suitable interconnection or the like as compared with such prior art methods.

In an alternate embodiment of the present invention, the methods of the invention may be employed for electroplating a layer of a metal such as aluminum on a surface of a semiconductor device, an integrated circuit or the like. In this embodiment, the methods as discussed above are employed except that in place of the aqueous electrolyte containing a precious metal compound dissolved therein, a non-aqueous liquid solvent containing an aluminum compound dissolved therein is employed. In this embodiment, it is believed that metal ion-solvent complexes are formed at the solid-liquid interface between the surface receiving the electrode deposit and the electrolyte. Thus, it is within the scope of the present invention to employ the methods as discussed above using non-aqueous liquid electrolytes containing a compound of the metal to be deposited dissolved therein.

The preceding description is set forth to illustrate specific embodiments of the invention and is not intended to limit the scope of the methods and products of the present invention. Additional embodiments and advantages within the scope of the claimed invention will apparent to one of ordinary skill in the art.

What is claimed is:

1. A method for electroplating a layer of a precious metal or copper on a surface of a semiconductor device, which method comprises:
   (a) providing an electrolytic cell comprising a cathode, an anode, a direct current source and an aqueous electrolyte containing a precious metal compound or a copper compound dissolved therein, said cathode comprising a semiconductor device having a surface for receiving a layer of precious metal or copper;
   (b) orienting the semiconductor device surface for receiving a layer of the precious metal or copper in a position normal to a vector representing the acceleration of gravity and facing the anode of the electrolytic cell, the anode being positioned in the direction of the acceleration of gravity with respect to said surface; and
   (c) employing an electroplating direct current on the order of about 0.1 milliamp/cm$^2$ in the electrolytic cell while superimposing an alternating current electromagnetic field in the range of about 1 to about 100 megahertz on the electroplating current, the strength of said electromagnetic field being sufficiently large to enhance the diffusion, mobility or mass transport of electrolyte ions in solution, said electroplating current and said electromagnetic field being employed in the absence of convection in the electrolyte, whereby a smooth, evenly distributed layer of the precious metal or copper is formed on the semiconductor device surface.

2. A method as defined by claim 1, wherein the electroplating direct current and the electromagnetic field are employed for a time sufficient to produce a smooth, evenly distributed layer of the precious metal or copper having a thickness in the range of about 1 to 10 microns.

3. A method as defined by claim 1, wherein the precious metal is selected from the group consisting of gold, silver and palladium.

4. A method as defined by claim 1, wherein the precious metal comprises gold.

5. A method as defined by claim 1, wherein steps (a)-(c) are conducted at ambient temperature.

6. A method as defined by claim 1, wherein the electromagnetic field is about 10 megahertz.

7. A method as defined by claim 1 wherein the aqueous electrolyte contains a copper compound dissolved therein and a layer of copper is formed on the surface of the semiconductor device.

8. A method as defined by claim 1 wherein the evenly distributed layer of the precious metal or copper formed on the semiconductor device surface has a microstructure that is characteristic of single crystals.

9. A method for electroplating a layer of precious metal or copper on a surface of a semiconductor device, which method comprises
  (a) providing an electrolytic cell comprising a cathode, an anode, a direct current source and an aqueous electrolyte containing a precious metal compound or a copper compound dissolved therein, said cathode comprising a semiconductor device having a surface for receiving a layer of precious metal or copper;
  (b) orienting the semiconductor device surface for receiving a layer of the precious metal or copper in a position normal to a vector representing the acceleration of gravity and facing the anode of the electrolytic cell, the anode being positioned in the direction of the acceleration of gravity with respect to said surface; and
  (c) employing an electroplating direct current on the order of about 0.1 milliamp/cm$^2$ in the electrolytic cell while superimposing an alternating current electromagnetic field on the electroplating current, said direct current being at or below a value at which the current yield for the deposition is 100 percent, and said electromagnetic field being in the range from about 1 to about 100 megahertz, the strength of said electromagnetic field being sufficiently large to enhance the diffusion, mobility or mass transport of electrolyte ions in solution, said electroplating current and said electromagnetic field being employed in the absence of convection in the electrolyte whereby a smooth, evenly distributed layer of the precious metal or copper is formed on the semiconductor device surface.

10. A method as defined by claim 9, wherein the electromagnetic field is from about 10 to about 15 megahertz.

11. A method as defined by claim 9, wherein the electromagnetic field is about 12 megahertz.

12. A method as defined by claim 9 wherein the evenly distributed layer of the precious metal or copper formed on the semiconductor device surface has a microstructure that is characteristic of single crystals.

13. A method for electroplating a layer of precious metal or copper on a surface of an integrated circuit device, which method comprises:
  (a) providing an electrolytic cell comprising a cathode, an anode, a direct current source and an aqueous electrolyte containing a precious metal compound or a copper compound dissolved therein, said cathode comprising an integrated circuit device having a surface for receiving a layer of precious metal or copper;
  (b) orienting the integrated circuit device surface for receiving a layer of the precious metal or copper in a position normal to a vector representing the acceleration of gravity and facing the anode of the electrolytic cell, the anode being positioned in the direction of the acceleration of gravity with respect to said surface; and
  (c) employing an electroplating direct current not greater than about 0.1 milliamp/cm$^2$ in the electrolytic cell while superimposing an alternating current electromagnetic field in the range of about 10 to about 15 megahertz on the electroplating current, the strength of said electromagnetic field being sufficiently large to enhance the diffusion, mobility or mass transport of electrolyte ions in solution, said electroplating current and said electromagnetic field being employed in the absence of convection in the electrolyte, whereby a smooth, evenly distributed layer of the precious metal or copper is formed on the integrated circuit device surface.

14. A method as defined by claim 23, wherein the electroplating direct current and the electromagnetic field are employed for a time sufficient to produce a smooth layer of the precious metal or copper having a thickness in the range of about 1 to 10 microns.

15. A method as defined by claim 13, wherein the precious metal is selected from the group consisting of gold, silver and palladium.

16. A method as defined by claim 13, wherein the precious metal comprises gold.

17. A method as defined by claim 13, wherein steps (a)-(c) are conducted at ambient temperature.

18. A method as defined by claim 13, wherein the electromagnetic field is about 12 megahertz.

19. A method as defined by claim 13 wherein the aqueous electrolyte contains a copper compound dissolved therein and a layer of copper is formed on the surface of the semiconductor device.

20. A method as defined by claim 13 wherein the evenly distributed layer of the precious metal or copper formed on the semiconductor device surface has a microstructure that is characteristic of single crystals.

21. A method for electroplating a layer of precious metal or copper on a surface of an integrated circuit device, which method comprises
  (a) providing an electrolytic cell comprising a cathode, an anode, a direct current source and an aqueous electrolyte containing a precious metal compound or a copper compound dissolved therein, said cathode comprising an integrated circuit device having a surface for receiving a layer of precious metal or copper;
  (b) orienting the integrated circuit device surface for receiving a layer of the precious metal or copper in a position normal to a vector representing the acceleration of gravity and facing the anode of the electrolytic cell, the anode being positioned in the direction of the acceleration of gravity with respect to said surface; and
  (c) employing an electroplating direct current on the order of about 0.1 milliamp/cm$^2$ in the electrolytic cell while superimposing an alternating current electromagnetic field on the electroplating current, said direct current being at a value at which the current yield for the deposition is 100%, and said electromagnetic field being in the range from about 1 to about 100 megahertz, the strength of said electromagnetic field being sufficiently large to enhance the diffusion, mobility or mass transport of electrolyte ions in solution, said electroplating current and said electromagnetic field being employed int he absence of convection in the electrolyte whereby a smooth, evenly distributed layer of the precious metal or copper is formed on the integrated circuit device surface.

22. A method as defined by claim 21, wherein the electromagnetic field is from about 10 to about 15 megahertz.

23. A method as defined by claim 21, wherein the electromagnetic field is about 12 megahertz.

24. A method as defined by claim 21 wherein the evenly distributed layer of the precious metal or copper formed on the semiconductor device surface has a microstructure that is characteristic of single crystals.

25. A method for electroplating a layer of aluminum on a surface of a workpiece, which method comprises:
  (a) providing an electrolytic cell comprising a cathode, anode, a direct current source and a liquid electrolyte containing an aluminum compound dissolved therein, said cathode comprising a workpiece having a surface for receiving a layer of aluminum;
  (b) orienting the workpiece surface for receiving a layer of the aluminum in a position normal to a vector representing the acceleration of gravity and facing the anode of the electrolytic cell, the anode being positioned in the direction of the acceleration of gravity with respect to said surface; and
  (c) employing an electroplating direct current not greater than about 0.1 milliamp/cm$^2$ in the electrolytic cell while superimposing an alternating current electromagnetic field in the range of from about 1 to about 100 megahertz, the strength of said electromagnetic field being sufficiently large to enhance the diffusion, mobility or mass transport of electrolyte ions in solution, said electroplating current and said electromagnetic field being employed in the absence of convection in the electrolyte, whereby a smooth, evenly distributed layer of the aluminum is formed on the workpiece surface.

26. A method as defined by claim 25 wherein the evenly distributed layer of aluminum formed on the workpiece surface has a microstructure that is characteristic of single crystals.

* * * * *